United States Patent
Nakamura

(10) Patent No.: US 6,225,702 B1
(45) Date of Patent: *May 1, 2001

(54) BALL GRID ARRAY TO PREVENT SHORTING BETWEEN A POWER SUPPLY AND GROUND TERMINAL

(75) Inventor: Hisashi Nakamura, Tokyo (JP)

(73) Assignee: Mitsubishi Denki Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/018,342

(22) Filed: Feb. 4, 1998

(30) Foreign Application Priority Data

Aug. 29, 1997 (JP) .................................. 9-234272

(51) Int. Cl.$^7$ ..................................... H01L 23/52
(52) U.S. Cl. ................ 257/786; 257/692; 257/738; 257/780; 361/768; 361/771
(58) Field of Search ................... 257/691, 692, 257/738, 786, 697, 737, 776, 780, 783, 760, 767, 768, 772

(56) References Cited

U.S. PATENT DOCUMENTS

| | | | |
|---|---|---|---|
| 5,483,099 | * | 1/1996 | Natarajan et al. ............ 257/691 |
| 5,490,040 | * | 2/1996 | Gaudenzi et al. ............ 257/738 |
| 5,502,278 | * | 3/1996 | Mabboux et al. ............ 257/691 |
| 5,545,923 | * | 8/1996 | Barber ........................ 257/691 |
| 5,554,881 | * | 9/1996 | Koyasu et al. .............. 257/786 |
| 5,640,048 | * | 6/1997 | Selna ........................... 257/738 |
| 5,641,988 | * | 6/1997 | Huang et al. ................ 257/692 |
| 5,691,568 | * | 11/1997 | Chou et al. .................. 257/691 |
| 5,714,801 | * | 2/1998 | Yano et al. .................. 257/691 |
| 5,717,245 | * | 2/1998 | Pedder ........................ 257/691 |
| 5,719,439 | * | 2/1998 | Iwasaki et al. .............. 257/786 |
| 5,719,449 | * | 2/1998 | Strauss ....................... 257/786 |
| 5,796,170 | * | 8/1998 | Marcantonio ............... 257/786 |
| 5,955,789 | * | 9/1999 | Vendramin ................. 257/786 |

FOREIGN PATENT DOCUMENTS

| | | | |
|---|---|---|---|
| 2-186670 | * | 7/1990 | (JP) . |
| 6151639 | * | 5/1994 | (JP) . |
| 6-151688 | | 5/1994 | (JP) . |

\* cited by examiner

*Primary Examiner*—Olik Chaudhuri
*Assistant Examiner*—Alonzo Chambliss

(57) ABSTRACT

A semiconductor device manufactured as a ball grid array, chip scale package, or other surface mounting package wherein shorting between a power supply terminal and a ground terminal can be prevented. At least one solder ball functioning as a signal electrode is disposed between a solder ball functioning as a power supply electrode and a solder ball functioning as a ground electrode on the mounting surface of the package.

5 Claims, 3 Drawing Sheets

BALL GRID ARRAY TO PREVENT SHORTING BETWEEN A POWER SUPPLY AND GROUND TERMINAL

BACKGROUND OF THE INVENTION

1. Field of the Invention

The present invention relates to a semiconductor device, and relates particularly to the electrode arrangement of a ball grid array (BGA), chip scale package (CSP), or other multiple pin, surface mounting package in which solder balls are used as the external electrodes by which connection to an external circuitry is achieved.

2. Description of the Related Art

Manufacturers of memory chips and application-specific IC (ASIC) devices have not been able to meet the demand for faster assembly, an increase in the number of pins, and continual reduction in chip size using the quad flat package and other conventional package designs in which pins are used for the external electrodes. This situation led to the development of BGA, CSP, and other surface mounting technologies in which solder balls are used for external electrodes, thereby also achieving thinner, smaller packages with a large number of external electrodes. Size is reduced and a large number of external electrodes is achieved in these packages by reducing the pitch between the solder balls functioning as external electrodes to less than 1 mm.

FIG. 7 is a plan view of the mounting surface of a conventional semiconductor device as described above. This semiconductor device 100 comprises a package 101 with a mounting surface 102 on which are formed solder balls constituting a plurality of external electrodes. Note that, as shown in FIG. 7, the solder balls formed on the mounting surface 102 include a plurality of solder balls 103a used as a power supply terminal, a plurality of solder balls 103b used as a ground terminal, and a plurality of solder balls 103c, that is, the solder balls other than the power supply terminal and ground terminal solder balls, used as signal electrodes.

When the distance between adjacent solder balls is less than 1 mm with this arrangement, solder shorting and shorting between electrodes caused by fixed or unfixed foreign matter can occur easily during the mounting process. Unlike with QFP and other types of pin packages, such shorting cannot be detected by naked eye observations or probing in BGA, CSP, and other types of surface mounting packages. Boundary scanning has therefore been used as one method of detecting defective connections and electrode shorting in BGA, CSP, and other types of surface mounting packages.

Boundary scanning can electrically detect shorts involving signal electrodes, that is, the external electrodes other than the power supply and ground electrodes. More specifically, boundary scanning can electrically detect shorting between signal electrodes, between a signal electrode and a power supply electrode, and between a signal electrode and ground electrode. Boundary scanning cannot, however, detect shorting between a power supply electrode and ground electrode. This is a particular problem when, for example, a plurality of solder balls 103a used as power supply terminals, and a plurality of solder balls 103b used as ground terminals, are arranged as shown in FIG. 7 with a solder ball pitch of 1 mm or less because this arrangement and electrode proximity can easily result in shorting between a power supply electrode and ground electrode due to solder debris and other foreign matter.

It should be noted that while its object differs from that of the present invention, a semiconductor device disclosed in Japanese Patent Laid-Open Publication No. 6-151688 (1994-151688) teaches the use of a lead for external electrodes as a means of preventing transistor misoperation by suppressing the change in power supply potential and ground potential as a result of disposing two signal leads between a power supply lead and a ground lead.

SUMMARY OF THE INVENTION

An object of the present invention is therefore to resolve the above problem by providing a semiconductor device formed from a ball grid array (BGA), chip scale package (CSP), or other surface mounting package whereby shorting between a power supply electrode and a ground electrode is prevented.

A semiconductor device according to the present invention is achieved in a surface mounting package with a plurality of solder balls used as external electrodes in an arrangement on the mounting surface such that power supply electrodes of different polarity are not adjacent. This arrangement makes shorting between a power supply electrode and ground electrode, which cannot be detected by boundary scanning, more difficult after mounting to the mounting surface. The boundary scanning detection rate of shorting between signal electrodes is thereby also greatly improved, and the reliability of the mounted semiconductor device can also be greatly improved.

The pitch between the solder balls of the external electrodes in the surface mounting package of the present invention is preferably 1 mm or less. Foreign matter such as solder debris inducing shorting between external electrodes is typically less than 1 mm in size, and even if shorting between external electrodes results from solder debris or other foreign matter, shorting occurs between a power supply electrode and signal electrode or between a ground electrode and signal electrode, and does not occur between a power supply electrode and ground electrode. Shorting between these electrodes can therefore be detected by boundary scanning, and the reliability of semiconductor device mounting can therefore be greatly improved.

The external electrodes of a semiconductor device according to the present invention are further preferably arranged such that at least one signal electrode that is not a power supply electrode is disposed between power supply electrodes of different polarity. Almost all shorting between external electrodes resulting from solder debris or other foreign matter occurs between a power supply electrode and signal electrode, or between a ground electrode and signal electrode. Considering this, disposing at least one signal electrode that is not a power supply electrode between power supply electrodes of different polarity makes shorting between a power supply electrode and a ground electrode even more difficult. As a result, the reliability of semiconductor device mounting can be greatly improved.

Other objects and attainments together with a fuller understanding of the invention will become apparent and appreciated by referring to the following description and claims taken in conjunction with the accompanying drawings, wherein like parts are designated by like references.

BRIEF DESCRIPTION OF THE DRAWINGS

These and other objects and features of the present invention will become clear from the following description taken in conjunction with the preferred embodiment thereof and the accompanying drawings throughout which like parts are designated by like reference numerals, and in which.

DETAILED DESCRIPTION OF THE PREFERRED EMBODIMENT

Figure 1:
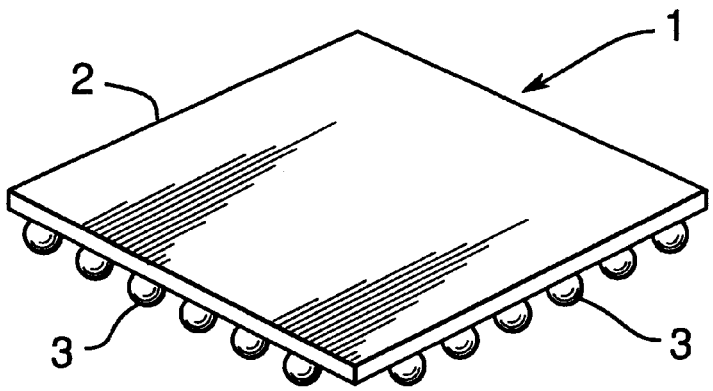
FIG. 1 is a perspective view of a semiconductor device according to a preferred embodiment of the present invention.
Figure 2:
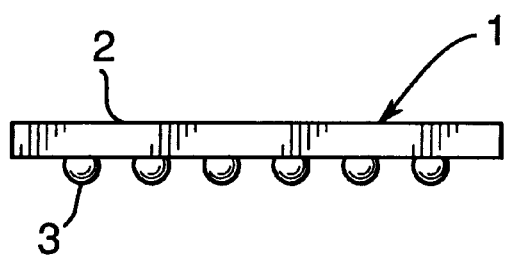
FIG. 2 is a side view of the semiconductor device shown in FIG. 1.

The preferred embodiments of the present invention are described below with reference to the accompanying figures, wherein FIGS. 1 and 2 are perspective and side views, respectively, of a semiconductor device 1 according to the present invention.

Figure 3:
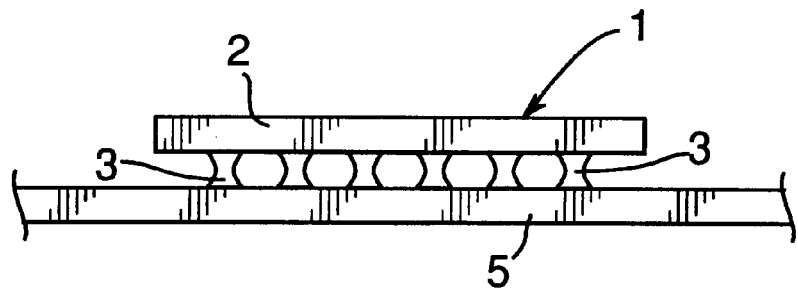
FIG. 3 is a side view of a semiconductor device shown in FIG. 1 and FIG. 2 when mounted to a mounting substrate.
Figure 4:
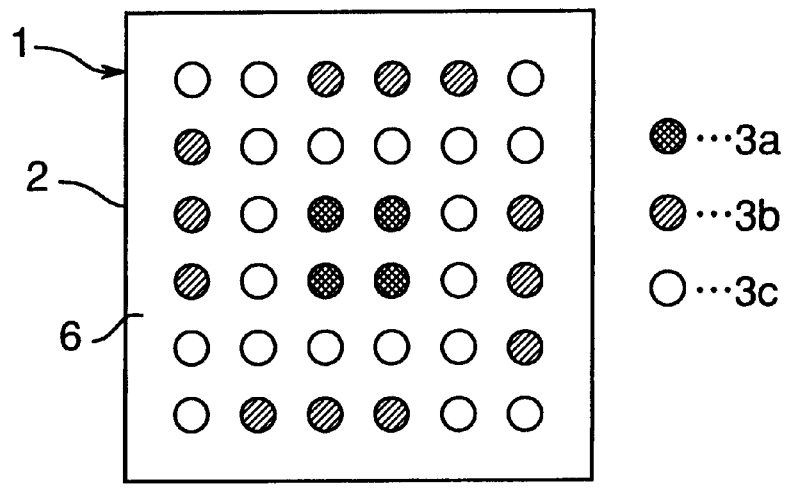
FIG. 4 is a plan view of the mounting surface of a semiconductor device shown in FIG. 1 and FIG. 2.

As shown in FIGS. 1 to 4, the semiconductor device 1 is a BGA, CSP, or other type of surface mounting package 2 comprising a mounting surface 6, as shown in FIG. 4. This mounting surface 6 interfaces with mounting substrate 5 in FIG. 3 when the semiconductor device is mounted to a mounting substrate. A plurality of solder balls 3 functioning as external electrodes of the package 2 are formed on this mounting surface 6 at a pitch of 1 mm or less. As a result, a package 2 with a 1.5 cm square mounting surface will have more than 150 solder balls 3 formed on the surface thereof. It should be noted that for simplicity of illustration a smaller total number of solder balls 3 is shown.

FIG. 3 is a side view of the semiconductor device 1 shown in FIGS. 1 and 2 mounted to a mounting substrate 5. A wiring pattern not shown in the figures is formed on the mounting substrate 5 on the surface thereof interfacing with the mounting surface 6 of the package 2. The solder balls 3 are thus arranged on the package mounting surface 6 in a pattern conforming to the wiring pattern of the mounting substrate 5. Heat is then applied to thermally fuse and electrically connect the solder balls 3 with the corresponding circuit elements of the mounting substrate 5.

FIG. 4 is a plan view of a mounting surface 6 of the semiconductor device 1. As indicated by the key to FIG. 4, the solder balls 3 formed on the mounting surface 6 of semiconductor device 1 include one or more solder balls 3a used as a power supply electrode, one or more solder balls 3b used as a ground electrode, and one or more solder balls 3c used as non-power supply and non-ground external signal electrodes.

AS will be known from FIG. 4, the solder balls 3a to 3c are arranged in a specific pattern on mounting surface 6 such that there is at least one solder ball 3c used as a signal electrode disposed between any solder ball 3a used as a power supply electrode and any solder ball 3b used as a ground electrode, and no power supply electrode solder ball 3a is thus adjacent to any ground electrode solder ball 3b.

Solder debris and other foreign matter causing shorting between any external electrodes is generally less than 1 mm in size. In addition, when solder debris or other foreign matter causes a short to an external electrode, the short substantially always occurs between a power supply electrode and a signal electrode, or between a ground electrode and a signal electrode, and shorts between a power supply electrode and a ground electrode occur only with great difficulty. As a result, substantially all shorts involving a power supply electrode can be detected with boundary scanning.

It should be noted that because the size of solder debris or other foreign matter causing a short with an external electrode is typically 1 mm or less as described above, shorting with a power supply electrode can be similarly impeded by increasing the distance between the power supply electrode solder balls 3a and ground electrode solder balls 3b without disposing a signal electrode solder ball therebetween. A mounting surface 6 exemplary of such alternative configuration is shown in FIG. 5 and FIG. 6.

Figure 5:
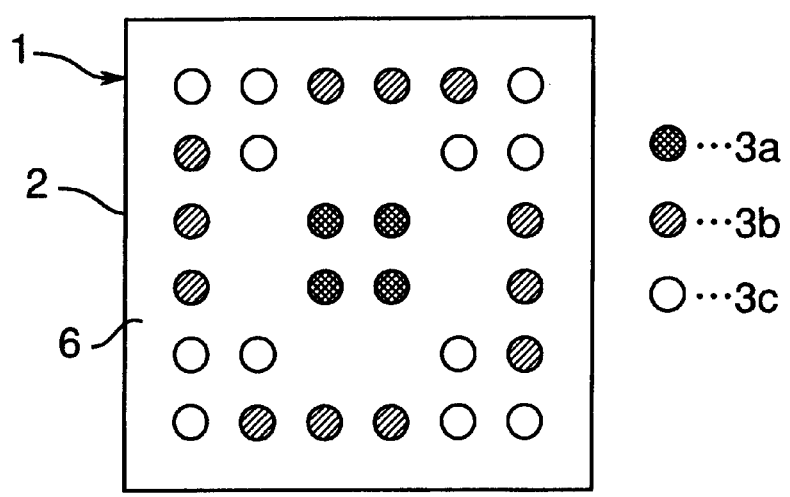
FIG. 5 is a plan view of an alternative arrangement of the mounting surface of a semiconductor device shown in FIG. 1 and FIG. 2.

With the pattern shown in FIG. 5, the signal electrode solder balls 3 are arranged such that there is a known gap equal to at least the solder ball pitch between any solder balls 3a and any solder balls 3b. This arrangement similarly reduces the probability of shorting between a power supply electrode and a ground electrode.

Figure 6:
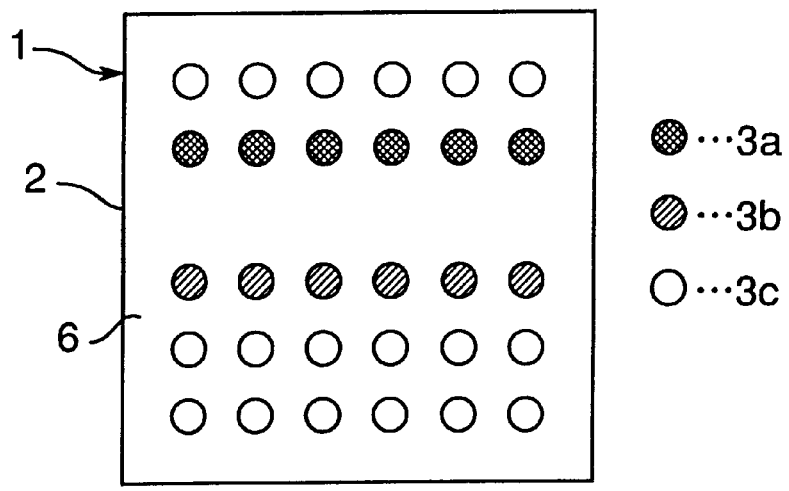
FIG. 6 is a plan view of a further alternative arrangement of the mounting surface of a semiconductor device shown in FIG. 1 and FIG. 2.
Figure 7:
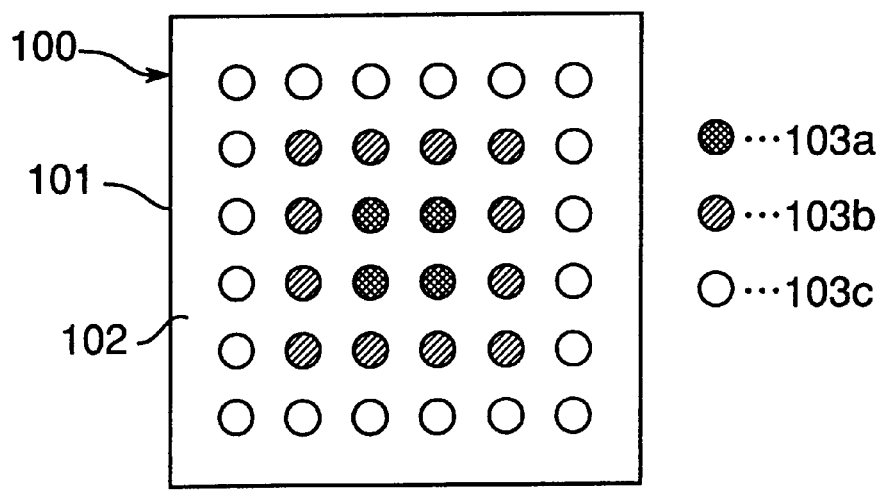
FIG. 7 is a plan view of the mounting surface of a semiconductor device according to a conventional arrangement.

With the pattern shown in FIG. 6, the solder ball pitch is increased only between the solder balls 3a and solder balls 3b. This arrangement also reduces the probability of shorting between a power supply electrode and a ground electrode.

As will be known from the preceding description of a semiconductor device according to the present invention, at least one solder ball 3c used as a signal electrode is disposed between any solder ball 3a used as a power supply electrode and any solder ball 3b used as a ground electrode in the pattern of a plurality of solder balls 3 formed on the mounting surface 6 of a semiconductor device 1 according to the present invention. As a result, shorting between a power supply electrode and a ground electrode after the package 2 is mounted to a mounting substrate 5, that is, shorting which cannot be detected by boundary scanning, is made more difficult, the boundary scanning detection rate of shorts between electrodes is greatly improved, and the reliability of semiconductor device mounting can be greatly improved.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

Although the present invention has been fully described in connection with the preferred embodiment thereof and the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A semiconductor device to be surface-mounted onto a mounting board, said semiconductor device having a mounting surface with a plurality of solder balls arranged at a pitch and isolated from each other, said plurality of solder balls including power supply, ground and signal solder balls for connection with power supply electrodes, ground electrodes and signal electrodes, respectively, which are formed on said mounting board in a manner of one to one;

each of the power supply solder balls is surrounded adjacently by a group consisting of the same voltage power supply balls and the signal solder balls and arranged apart from each of the ground solder balls by a distance equal to or larger twice the pitch; and each of the ground solder balls is surrounded adjacently by a group consisting of the ground solder balls and the signal balls and arranged apart from each of the power supply solder balls by a distance equal to or larger than twice the pitch.

2. The semiconductor device according to claim 1, wherein the same voltage power supply balls are concentrically arranged as a power supply solder ball cluster in which each of the same voltage power supply balls is adjacent to other same voltage power supply balls.

3. The semiconductor device according to claim 1, wherein the ground solder balls are concentrically arranged as a ground solder ball cluster, in which the ground solder balls are adjacent with each other.

4. The semiconductor device according to claim 1, wherein the signal solder balls are arranged between two clusters of different voltages.

5. The semiconductor device according to claim 1, wherein any solder balls are not arranged between two clusters of different voltages. above-identified application.

* * * * *